(12) United States Patent
Degani et al.

(10) Patent No.: US 6,232,212 B1
(45) Date of Patent: May 15, 2001

(54) FLIP CHIP BUMP BONDING

(75) Inventors: Yinon Degani, Highland Park; Dean Paul Kossives, Glen Gardner, both of NJ (US)

(73) Assignee: Lucent Technologies, Murray Hill, NJ (US)

( * ) Notice: Subject to any disclaimer, the term of this patent is extended or adjusted under 35 U.S.C. 154(b) by 0 days.

(21) Appl. No.: 09/256,443

(22) Filed: Feb. 23, 1999

(51) Int. Cl.⁷ .................................................. H01L 21/44
(52) U.S. Cl. ........................ 438/612; 438/613; 438/614
(58) Field of Search .................................... 438/612, 613, 438/614, 615, 584, 597

(56) References Cited

U.S. PATENT DOCUMENTS

| | | | |
|---|---|---|---|
| 5,137,845 | * | 8/1992 | Lochon et al. ............... 437/183 |
| 5,767,010 | * | 6/1998 | Mis et al. ..................... 438/614 |
| 5,885,891 | * | 3/1999 | Miyata et al. ................. 438/612 |
| 5,937,320 | * | 8/1999 | Andricacos et al. ......... 438/614 |

* cited by examiner

*Primary Examiner*—David Nelms
*Assistant Examiner*—David Vu
(74) *Attorney, Agent, or Firm*—Peter V. D. Wilde; Thomas, Kayden, Horstemeyer & Risley LLP

(57) ABSTRACT

The specification describes techniques for applying solder bumps to IC chips. The solder bump sites are first provided with under bump metallization (UBM) for solder bump interconnections to the Al bonding sites on the IC chip. The substrate, i.e. the capping layer of the IC chip, is coated with photoresist and patterned to expose the UBM and a peripheral portion of the capping layer around the UBM. The solder paste is then applied and reflowed to form the solder bump. Since the photoresist hardens and becomes difficult to remove after the reflow step, a sacrificial buffer layer is interposed between the photoresist and the capping layer to facilitate removal of the photoresist without attacking the IC chip surface.

15 Claims, 4 Drawing Sheets

FLIP CHIP BUMP BONDING

FIELD OF THE INVENTION

This invention relates to electronic assembly technology and more specifically to solder bump interconnections for mounting IC chips and the like on interconnection substrates like silicon, ceramic, or printed circuit boards.

BACKGROUND OF THE INVENTION

Solder bump interconnection techniques for both electrically contacting component packages and mounting them on interconnection substrates such as printed circuit boards have become widely used in the manufacture of electronic devices. The term interconnection substrates includes several forms of electronic device supports including, e.g., silicon and ceramic. For convenience reference to such supports herein will be to printed wiring boards as a generic term.

State of the art component packages are small and lightweight and can be surface mounted to printed circuit boards using fine patterns of solder bumps. Typically, bumps or pads are formed on the printed wiring board and the component package in mirror arrays that mate when the component package is properly placed. Assembly is completed by applying heat to melt the solder and form the solder bond and interconnection. This technique is used in flip-chip technology where the surface of the IC chip in the component package is provided with bonding pads or bumps and the chip is mounted upside down on the printed wiring board.

The solder bumps are formed on arrays of I/O contact pads prior to assembly. To facilitate localized or selective application of solder to the array of contact pads the surface of the pads should be solder wettable. Accordingly, the bonding sites on the components being joined are first provided with under bump metallization (UBM). The solder, typically a tin based solder, e.g. tin-lead, tin-antimony, is then applied to the UBM.

There is a growing choice of methods for applying solder bumps to IC chips and interconnection substrates. The most common, is to print a pattern of solder paste through a screen or stencil, then remove the stencil and reflow the solder. In a similar approach, which eliminates the paste, solder is evaporated through a shadow mask onto the UBM. In both cases, reliability problems increase as the features in the stencil or mask are shrunk to meet demands for ever smaller interconnection pitch. Stencil and shadow mask techniques are, in general, limited to applications in which bump pitch is of the order of 200 $\mu$m or more.

Finer patterns can be produced using thick photoresist patterns and evaporating solder onto the pattern, then removing the unwanted portions using lift-off. However, evaporation of uniform layers on large substrates or boards requires costly equipment and, moreover, is generally limited to high lead solder compositions in order to achieve reasonable evaporation rates.

Solder bumps can also be applied in fine pitch arrays using electrolytic or electroless solder plating. Both techniques use photolithography to define the solder bumps and precisely placed, fine line, bump patterns can be produced. However, use of electrolytic and electroless processes raise other reliability issues. They require very clean processing environments and ultra-clean, electrically active, substrate surfaces, adding cost and complexity to the process.

A recent proposal for solder bump application combines the fine features and precision of photolithography, with the simplicity of solder paste techniques. After forming the UBM, which defines the bump sites, the substrate is coated with a thick layer of photoresist. The bump pattern is then exposed and developed in the photoresist leaving a thick patterned mask. The openings in the photoresist mask are made larger than the desired bump size to provide sufficient solder volume from the solder paste for the final bump. The solder paste is applied in the conventional manner to the openings in the photoresist mask. The solder paste is heated to reflow, and the solder bump self aligns to the only available wettable surface, the UBM. The photoresist is then removed. The risk of excessive solder flow and bridging is avoided because the photoresist mask, which isolates each bump site, remains in place during reflow. Using this technique, solder bump pitch patterns of less than 200 $\mu$m can be produced with high reliability. However, a drawback to this technique is that removal of the photoresist mask after the solder bumps have been formed has proven difficult. This is due to thermally induced crosslinking of the photoresist during the reflow step. It is especially the case when high melting point solders are used. It is well known that prepolymer materials crosslink under the influence of both heat and light. In photolithography, the prepolymer materials are chosen so that a given level of crosslinking will occur under actinic exposure. This level is enough to make the exposed material sufficiently robust to function as a photomask, but still allow it to be easily removed later in processing. If crosslinking exceeds the design level for the photoresist material, removal can be difficult. Photoresist materials are known to form tenacious coatings if subjected to thermal treatments more severe than those for which the material is designed. Accordingly, it can be expected that a photoresist mask, when left in place during a solder reflow step, will tend to crosslink excessively and resist removal. Moreover, in a typical application, the IC chip to which the solder bumps are applied is coated with a capping layer, usually a polyimide. The photoresist polymer, on heating, will stick to the polyimide and may even crosslink to it. Removal of the photoresist, without attacking the IC capping layer, is problematic. Wet solvents are, in many cases, inadequate. Dry etching, i.e. ashing, of the photoresist is more effective but there is little dry etch selectivity between the developed and hardened photoresist, and the capping layer. The same issue arises when this solder bump process is applied to epoxy-glass interconnection substrates.

SUMMARY OF THE INVENTION

A technique has been developed for overcoming the problem of photoresist process incompatibility in the solder bump process described above. According to this technique a buffer layer is interposed between the IC or interconnection substrate, and the photoresist layer. The buffer layer is preferably a thin layer of metal that prevents adhesion of the photoresist to underlying surfaces. The buffer layer can be easily deposited and easily removed. It protects the underlying layers and allows effective techniques, e.g. plasma etching, to be employed to remove the photoresist. In the preferred embodiments, the steps for forming the buffer layer are integrated with forming the UBM.

DETAILED DESCRIPTION

Figure 1:
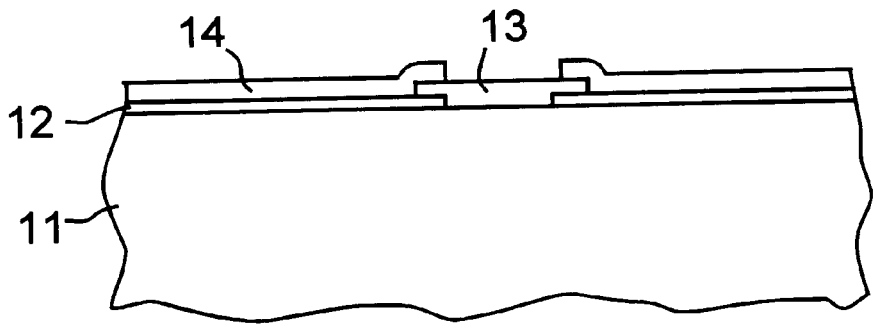
FIGS. 1–12 are schematic representations of process steps used in the improved technique for photoresist masking and solder bump formation.

Referring to FIG. 1, a portion of an IC chip substrate is shown at 11, with field oxide shown at 12 and aluminum contact at 13. A capping layer of polyimide is shown at 14. It will be recognized by those skilled in the art that the figures are not drawn to scale. The bonding site 13 may be an interlevel metal interconnection or a substrate, e.g. source drain window, contact. Details of the underlying semiconductor structure are not shown and are not critical to the invention. The objective is to provide the surface of the aluminum bonding site 13 with a ball, or bump, of solder. Since solder will not wet the aluminum contact, the first step in the solder bump operation is to form the UBM. The metals used in UBM should include a layer that adheres well to aluminum, and a layer that is wettable by typical tin solder formulations. A layer structure that meets these requirements is a composite of titanium, chromium and copper. Titanium is deposited first, to adhere to the aluminum, chromium/copper is deposited on the titanium, and copper is deposited over the chromium/copper to provide a solder wettable surface. Chromium/copper provides an effective transition layer between the titanium layer and the copper layer. Solder alloys dissolve copper and de-wet from titanium. Therefore, a thin layer of copper directly on titanium will dissolve into the molten solder and then the solder will de-wet from the titanium layer. To insure interface integrity between the solder and the UBM, a composite or alloy layer of chromium and copper is typically used between the titanium layer and the copper layer. Alternatively, the UBM may comprise Cr, Cr/Cu, Cu. Other UBM materials can also be used.

The aforementioned layers are conventionally sputtered, so several options for depositing them are available. The Cr-Cu layer can be sputtered from an alloy target, or it can be sputtered using a chromium target, then changing to a copper target.

Figure 2:
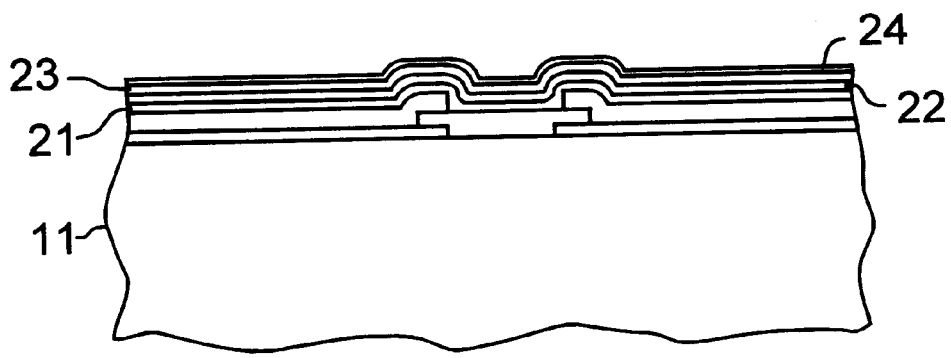

The multilayers for the UBM are deposited sequentially to form the composite layered structure as shown in FIG. 2. In the preferred embodiment, the layers are sputtered in a sputtering apparatus containing a titanium target, a chromium target and a copper target. Sputtering techniques are well known and the details are not necessary for this description. Other techniques for depositing the metal layers, e.g. evaporation or plating, can also be used.

The first layer 21 is titanium with a thickness of the order of 500–5000 Angstroms and preferably 1000–3000 Angstroms. Titanium adheres well to the aluminum contact 13 and to the capping polyimide layer. It also is not wettable by typical solder alloys. The importance of this property will be evident later.

The second layer 22 is a thin transition layer of Cr/Cu to provide a solder wettable and metallurgically sound interface between the titanium layer and the subsequently formed copper layer. Layer 22 is preferably formed by sputtering and has a thickness of the order of 1000–5000 Angstroms, and preferably 2000–3000 Angstroms.

The next layer 23 is a copper layer with a thickness of the order of 1000–10000 Angstroms, and preferably 2000–6000 Angstroms. The copper layer 23 is wettable with solder materials commonly used for the solder bumps. The melting point of most copper eutectics with tin solders is relatively low, and at the soldering temperature the surface of the copper layer dissolves in the solder bump forming a physically and electrically sound bond. Even if all the copper dissolves into the solder layer the solder will still adhere and wet the Cr/Cu layer.

FIG. 2 shows an optional layer 24 of gold that may be applied to the surface of the copper layer to inhibit oxidation of the copper surface. The optional gold layer has a thickness of 500–3000 Angstroms, and preferably 1000–2000 Angstroms.

Figure 3:
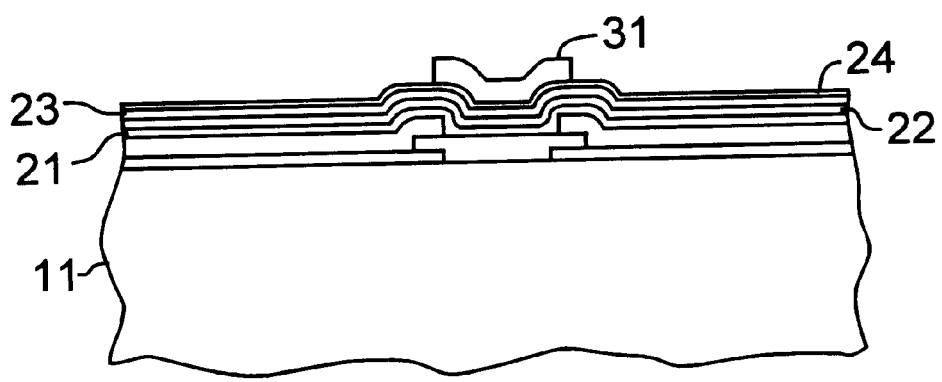

As shown in FIG. 3 an etch mask 31 is applied to mask the solder bump area. The etch mask is preferably a conventional photoresist and is formed by spinning photoresist on the surface layer and patterning the photoresist with suitable actinic radiation. FIG. 3 shows the developed photomask at 31. Alternative masking techniques can be used such as e.g. an oxide hardmask.

With the photomask in place the gold layer 24, if present, and the copper layer 23 are etched using conventional etchant solutions. Gold etchants include potassium cyanide/ferricyanide solutions, iodide/iodine solutions, and aqua regia. Copper is etched with, e.g., iron chloride, or a mixture of sulfuric acid and potassium chromate. The etch step for copper/chromium layer 22 should proceed without damage to the overlying copper layer. A suitable etchant is a basic solution of sodium hydroxide and potassium ferricyanide with a copper complexing agent such as ammonium hydroxide added to prevent formation of a passivating layer.

It will be recognized by those skilled in the art that the technique just described is a subtractive process and is similar to that described in U.S. patent application No. 08/825,923 filed Apr. 02, 1997. Other multilayer UBM techniques, e.g. using a shadow mask to define the UBM pads, can be used. However, the limitations of shadow mask techniques for making fine pitch solder bump arrays has already been mentioned.

Figure 4:
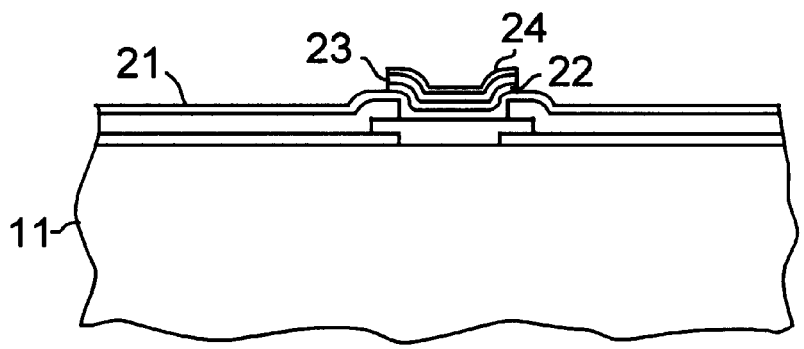

According to one embodiment of the invention, the titanium layer 21 is left in place to serve as the barrier layer. This is illustrated in FIG. 4.

Figure 5:
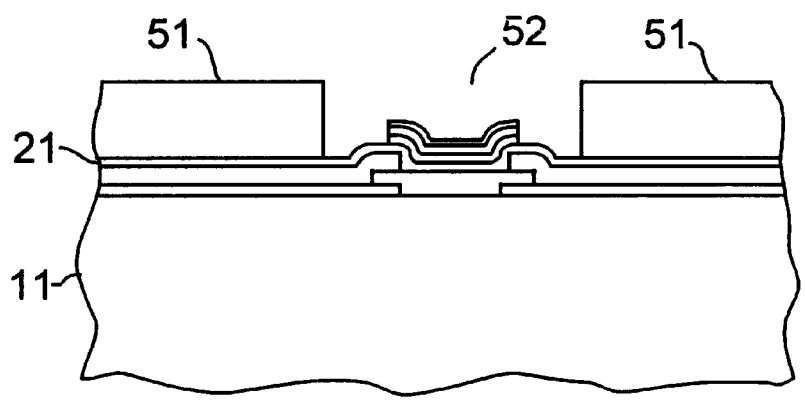

The photoresist mask is then applied using known photoresist techniques. The mask is formed by spinning photoresist on the surface and patterning the photoresist with suitable actinic radiation. The photoresist mask is shown at 51 in FIG. 5. It is patterned to expose the UBM at the solder bump site, and is deliberately made larger than the UBM to provide a sufficient volume of solder paste to form the desired size solder bump. Typically, when solder paste is reflowed to solder there is approximately 50% shrinkage in volume. Accordingly, the area of the window 52 in the photoresist mask, times the height or thickness of the photoresist mask, should approximate the desired solder paste volume, and twice the solder bump volume. Assuming the solder bump is approximately ball shaped, a 100 $\mu$m (diameter) solder bump requires approximately 33 mil$^3$ of solder paste. It is preferred that a space remain separating the solder bump and the photoresist mask to facilitate removal of the photoresist and to provide a reasonable aspect ratio for the mask opening. An appropriate ratio for the width (diameter) of the opening to the width (diameter) of the solder ball is 1.1–2.0. Given the assumption from above that the volume of the mask opening (solder paste) is twice the volume of the solder bump, the photoresist mask thickness $\underline{t}$ and the diameter $\underline{d}_1$ of the opening in the photomask are related to $\underline{d}_2$ the approximate solder bump diameter by:

$$\pi(d_1/2)^2 t = 2(4/3)\pi(d_2)^3$$

If $d_1 = 1.1 – 2.0 \ d_2$ this reduces to the approximate range: $t = (0.33 – 1.1)d_2$.

Figure 6:
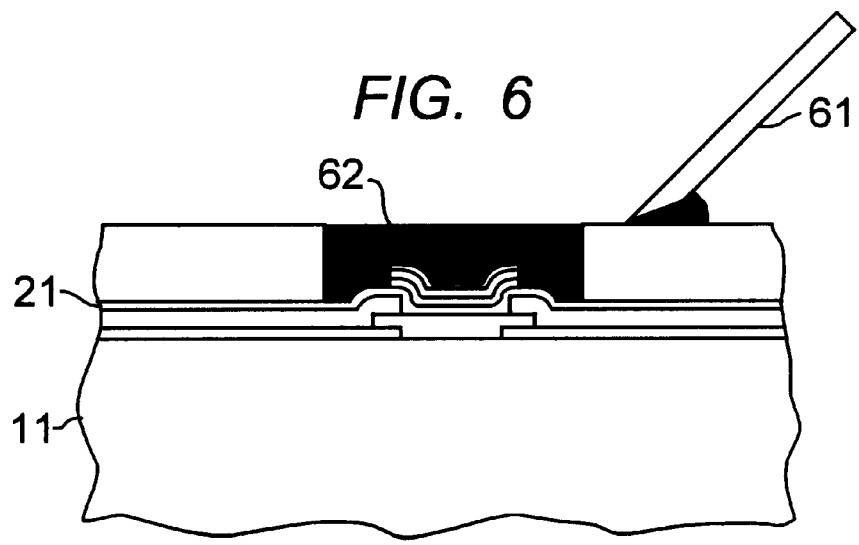

The opening 52 in the photoresist mask is then filled with solder paste using standard procedures. FIG. 6 illustrates this step, and a conventional squeegee 61 is shown applying the paste. The applicator 61 is representative of various suitable methods for applying solder paste 62 (and is obviously not to scale).

Figure 7:
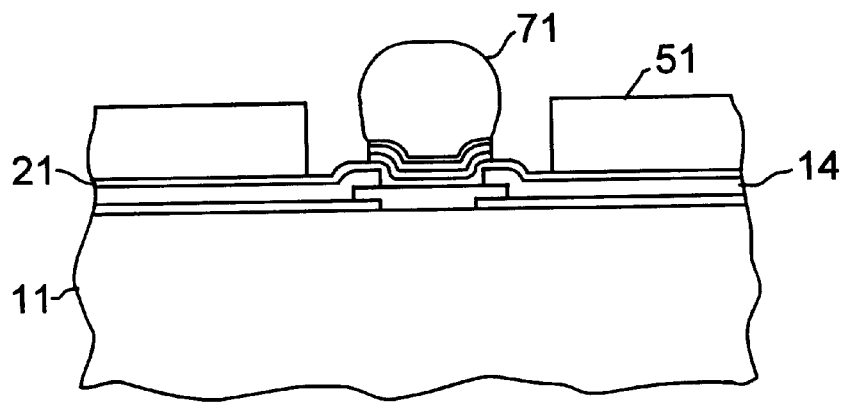

FIG. 7 shows the solder bump 71 after solder reflow. The reflow conditions will vary with the paste used. For example, using a 63/37 Sn/Pb or 95/5 Sn/Sb, a typical thermal treatment is to heat for 3 min. to reach a temperature approximately 15° C. below the liquidus and then heat for an additional 30 sec. to rise to 20–30° C. above the liquidus, then cool rapidly (~2 min.) to room temperature. Under the usual reflow conditions the polymer in the photoresist mask 51 will undergo additional crosslinking and will harden and adhere tenaciously to polyimide layer 14. The latter is prevented in the structure of FIG. 7 by buffer layer 21. The photoresist mask is removed by a conventional wet solvent photoresist stripper, e.g. PRS 1000 heated to 50° C., followed by a standard plasma etch to remove residual polymer. The plasma etch would normally attack the underlying polyimide layer 14 but for the presence of buffer layer 21. Thus, due to the presence of the buffer layer a relatively severe photoresist removal step or steps can be used without damage to the underlying substrate. This allows complete removal of the photoresist.

Figure 8:
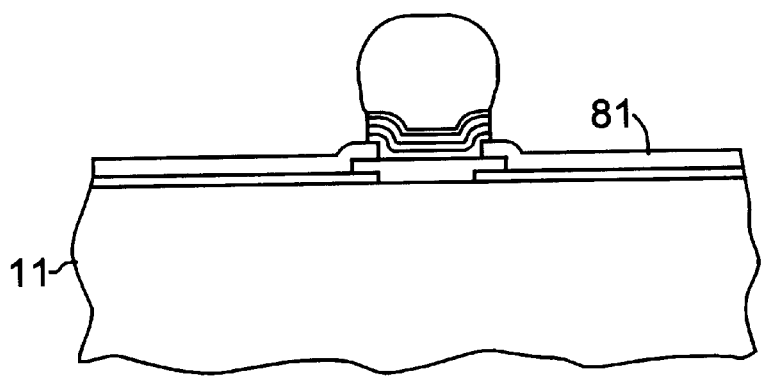

After stripping the photoresist mask, the buffer layer 21 is then etched away using the solder bump and UBM as a mask. The buffer layer is preferably etched using a standard wet etch process. For the case of Ti, the buffer layer can be removed with 2.5% HF in 1:3 $H_2O$/ethylene glycol. The resulting structure is shown in FIG. 8 with the substrate surface 81 cosmetically clean.

Alternatives for forming the buffer layer will occur to those skilled in the art. The preferred, and most cost effective, way is to integrate the formation of the buffer layer with the UBM, as described above. The titanium layer is chosen as the buffer layer because solder does not effectively wet titanium. This characteristic is important and allows surface tension to create the solder bump as shown in FIG. 7. It is evident that this approach requires the buffer layer to be conductive, as it is part of the UBM. However, other options allow the buffer layer to be non-conductive, with the buffer layer selectively applied so as to expose the UBM. Another option is to coat the substrate with a non-wetting metal and expose the UBM using photolithography prior to the application of the photoresist solder paste mask, or after application of the solder paste mask, in which case the solder paste mask can be used to remove the buffer layer material from the UBM region. This option is shown in FIGS. 9–12.

Figure 9:
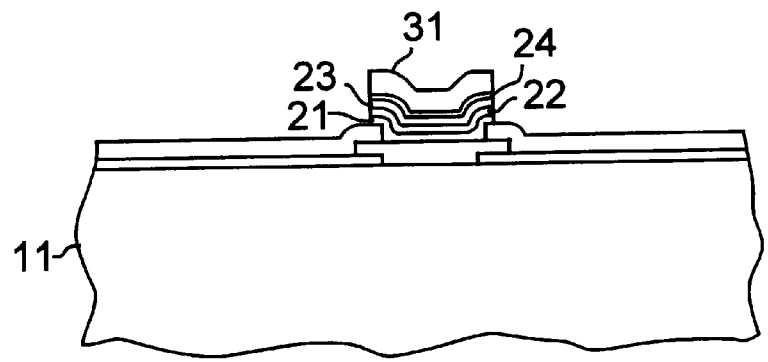

FIG. 9 shows the structure just after FIG. 3, with photomask 31 still in place. The titanium layer 21, which was retained as the buffer layer in the earlier embodiment, is etched from the substrate along with the other layers 22–24. This is the normal sequence for forming UBM by a subtractive method.

Figure 10:
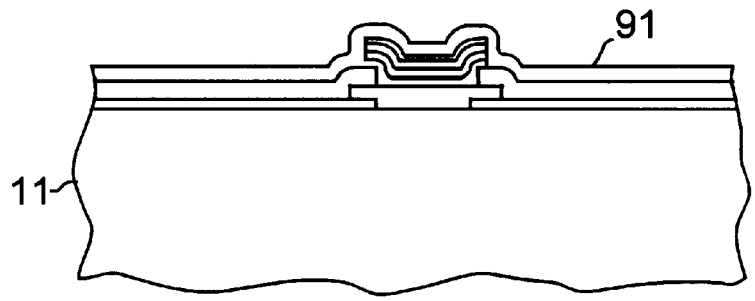
Figure 11:
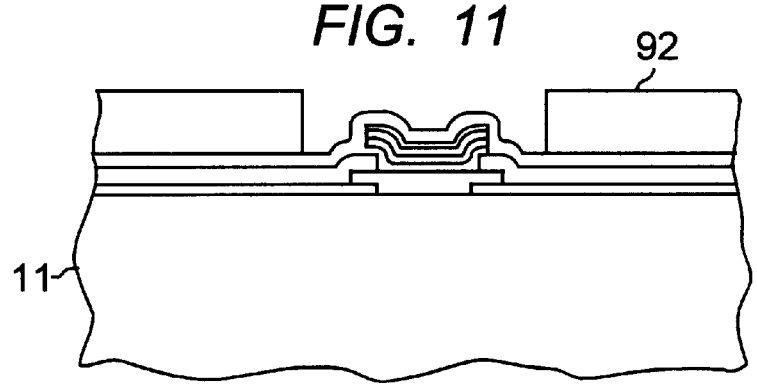

The buffer layer 91 is then blanket deposited as shown in FIG. 10. Preferably this layer is of a non-wetting material. A "non-wetting" material, as the term is used herein, is defined as a material that is not wet by solder. Suitable materials include aluminum, titanium, molybdenum, tungsten. The thickness of layer 91 is relatively immaterial. It should be thick enough to serve as a buffer layer yet thin so as to be easily removed. A range of 0.1–5 $\mu$m is appropriate. The solder paste photoresist mask 92 is then applied as shown in FIG. 11. With mask 92 in place, the exposed portions of the buffer layer 91 are etched away. A wet etch, e.g. HF or PAE etch, can be used for aluminum. The resulting structure appears as in FIG. 12, with buffer layer 91 under the photoresist mask layer 92. The remaining processing follows that described earlier.

Figure 12:
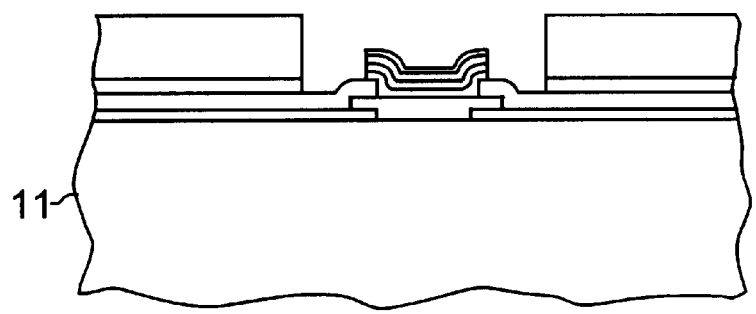

The use of the solder paste photoresist mask to also pattern the buffer layer as just described is convenient and saves processing cost. However, cases may arise where the capping layer that is exposed in the steps described in connection with FIG. 12 is susceptible to damage when the thick solder paste mask is removed. Accordingly, it may be preferred in some instances to pattern the buffer layer 91 in a separate photoresist step, leaving just the UBM exposed. The structure in this case would appear the same as in FIG. 12 except that the buffer layer would cover the capping layer.

EXAMPLE

Deposition of the UBM layers 21–24 is performed on a Sputtered Films Inc. Endeavor cluster tool. The coated wafers are then patterned by conventional lithography. Wafers are placed in a YES vapor prime oven with an adhesion promoter, e.g. HMDS, for 5 min. The wafers are spin coated with 5 $\mu$m of AZ4620 photoresist on a MTI Flexifab track, and softbaked for 1 min. at 100° C. Patterns are exposed in the resist using a GCA stepper exposure system (t=30s, or about 200 mJ), and developed with AZ400k developer (t=2 min.). The wafers are then hardbaked on a hotplate at 130° C. for 2 min. prior to etching. The copper and Cr/Cu layers are then etched and the photoresist removed. The solder paste photoresist mask is then applied using essentially the photoresist procedure described above and the solder paste is applied to the patterned mask using a conventional squeegee. The solder paste photoresist mask is approximately 100 $\mu$m thick, with openings for the solder paste of approximately 160 $\mu$m in diameter. The solder paste is then reflowed in heated nitrogen to form solder bumps with a diameter of approximately 120 $\mu$m. The photoresist is then stripped in PRS1000 for 30 min. @ 100° C., followed by a plasma strip to remove residual photoresist. The titanium layer is then etched away using 2.5% HF in $\frac{1}{3}$ water ethylene glycol solution. The resulting wafers have selectively applied UBM and solder bumps with the surrounding surface cosmetically clean.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for bonding an IC chip to a support substrate, said IC chip having a a plurality of aluminum bonding sites and a capping layer surrounding the plurality of aluminum bonding sites, comprising the steps of:
    (a) selectively applying under bump metallization (UBM) to the aluminum bonding sites, leaving portions of the capping layer exposed,
    (b) forming a buffer layer directly on the said portions of the capping layer,
    (c) forming a photoresist mask on said buffer layer, said photoresist mask having open portions thereof exposing said UBM,
    (d) filling said open portions of the photoresist mask with solder paste,
    (e) heating said solder paste to reflow the solder paste and form solder bumps on said UBM,
    (f) removing said photoresist mask, and
    (g) removing said buffer layer.

2. The process of claim 1 wherein a portion of said buffer layer is part of said UBM.

3. The process of claim 2 wherein said UBM is a layered structure comprising at least two metal layers, and one of said metal layers extends over said capping layer to form said buffer layer.

4. The process of claim 3 wherein said UBM is a layered structure comprising Ti, Cr/Cu,Cu, and the titanium layer extends over said capping layer to form said buffer layer.

5. The process of claim 1 wherein said capping layer is polyimide.

6. The method of claim 1 wherein the buffer layer is selected from the group consisting of titanium, aluminum, molybdenum, and tungsten.

7. A process for bonding an IC chip to a support substrate, said IC chip having a plurality of aluminum bonding sites and a capping layer surrounding the plurality of aluminum bonding sites, comprising the steps of:
 (a) depositing under bump metallization (UBM) on the IC chip, the UBM comprising at least two metal layers, a first metal layer deposited on the capping layer, and a second metal layer deposited on the first metal layer,
 (b) patterning the second metal layer to cover at least a portion of said aluminum bonding sites, leaving portions of the first metal layer exposed,
 (c) forming a photoresist mask on said portions of the first metal layer, said photoresist mask having open portions thereof exposing said UBM,
 (e) filling said open portions of the photoresist mask with solder paste,
 (f) heating the solder paste to reflow the solder paste to form solder bumps on said UBM,
 (g) removing said photoresist mask, and
 (h) removing said portions of the first metal layer.

8. The process of claim 7 wherein the first metal layer comprises a metal that is not wettable with the solder.

9. The method of claim 8 wherein the first metal layer is selected from the group consisting of titanium, aluminum, molybdenum, and tungsten.

10. The process of claim 7 wherein open portions of said photoresist mask expose a peripheral region of said buffer layer surrounding said UBM layer.

11. A process for bonding an IC chip to a support substrate, said IC chip having a plurality of aluminum bonding sites and a capping layer surrounding the plurality of aluminum bonding sites, comprising the steps of:
 (a) selectively applying under bump metallization (UBM) to the aluminum bonding sites, leaving portions of the capping layer exposed,
 (b) blanket depositing a metal layer on said portions of the capping layer and said UBM,
 (c) forming a photoresist mask on said metal layer, said photoresist mask having open portions thereof exposing said metal layer over said UBM,
 (d) etching away the metal layer over said UBM, using said patterned photoresist mask as an etch mask,
 (e) filling said open portions of the photoresist mask with solder paste,
 (f) heating the solder paste to reflow the solder paste and form solder bumps on said UBM,
 (g) removing said photoresist mask, and
 (h) removing said metal layer.

12. The process of claim 11 wherein the first UBM layer comprises a material that is not wettable with the solder.

13. The process of claim 12 wherein said capping layer comprises polyimide.

14. The process of claim 11 wherein open portions of said photoresist mask expose a peripheral region of said capping layer surrounding said UBM.

15. The method of claim 12 wherein the metal layer is selected from the group consisting of titanium, aluminum, molybdenum, and tungsten.

* * * * *